(12) United States Patent
Cheng et al.

(10) Patent No.: US 7,170,126 B2
(45) Date of Patent: Jan. 30, 2007

(54) STRUCTURE OF VERTICAL STRAINED SILICON DEVICES

(75) Inventors: Kangguo Cheng, Beacon, NY (US); Dureseti Chidambarrao, Weston, CT (US); Rama Divakaruni, Ossining, NY (US); Oleg G. Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,227

(22) Filed: Sep. 16, 2003

(65) Prior Publication Data

US 2005/0059214 A1 Mar. 17, 2005

(51) Int. Cl.
*H01L 27/108* (2006.01)
*H01L 29/76* (2006.01)

(52) U.S. Cl. ...................... 257/302; 257/296
(58) Field of Classification Search ............... 257/296, 257/302, 301
See application file for complete search history.

(56) References Cited

U.S. PATENT DOCUMENTS

| | | | |
|---|---|---|---|
| 3,602,841 A | 8/1971 | McGroddy | 331/107 G |
| 4,665,415 A | 5/1987 | Esaki et al. | 257/190 |
| 4,853,076 A | 8/1989 | Tsaur et al. | 438/479 |
| 4,855,245 A | 8/1989 | Neppl et al. | 438/207 |
| 4,952,524 A | 8/1990 | Lee et al. | 438/437 |
| 4,958,213 A | 9/1990 | Eklund et al. | 257/378 |
| 5,006,913 A | 4/1991 | Sugahara et al. | 257/67 |
| 5,060,030 A | 10/1991 | Hoke | 257/194 |
| 5,081,513 A | 1/1992 | Jackson et al. | 257/57 |
| 5,108,843 A | 4/1992 | Ohtaka et al. | 428/446 |
| 5,134,085 A | 7/1992 | Gilgen et al. | 438/210 |
| 5,256,550 A | 10/1993 | Laderman et al. | |
| 5,310,446 A | 5/1994 | Konishi et al. | 117/58 |
| 5,354,695 A | 10/1994 | Leedy | 438/411 |
| 5,371,399 A | 12/1994 | Burroughes et al. | 257/451 |
| 5,391,510 A | 2/1995 | Hsu et al. | 438/301 |
| 5,459,346 A | 10/1995 | Asakawa et al. | 257/347 |
| 5,461,243 A | 10/1995 | Ek et al. | |
| 5,471,948 A | 12/1995 | Burroughes et al. | 438/93 |
| 5,557,122 A | 9/1996 | Shrivastava et al. | 257/309 |
| 5,561,302 A | 10/1996 | Candelaria | 257/24 |
| 5,565,697 A | 10/1996 | Asakawa et al. | 257/347 |
| 5,571,741 A | 11/1996 | Leedy | 438/27 |
| 5,592,007 A | 1/1997 | Leedy | 257/347 |
| 5,592,018 A | 1/1997 | Leedy | 257/619 |
| 5,670,798 A | 9/1997 | Schetzina | 257/96 |
| 5,679,965 A | 10/1997 | Schetzina | 257/103 |

(Continued)

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

(Continued)

*Primary Examiner*—Zandra V. Smith
*Assistant Examiner*—Kiesha Rose
(74) *Attorney, Agent, or Firm*—Eric W. Petraske; Joseph P. Abate (57) ABSTRACT

A trench capacitor vertical-transistor DRAM cell in a SiGe wafer compensates for overhang of the pad nitride by forming an epitaxial strained silicon layer on the trench walls that improves transistor mobility, removes voids from the poly trench fill and reduces resistance on the bitline contact.

14 Claims, 6 Drawing Sheets

U.S. PATENT DOCUMENTS

| | | | |
|---|---|---|---|
| 5,683,934 A | 11/1997 | Candelaria | 438/151 |
| 5,840,593 A | 11/1998 | Leedy | 438/6 |
| 5,847,419 A * | 12/1998 | Imai et al. | 257/192 |
| 5,861,651 A | 1/1999 | Brasen et al. | 257/411 |
| 5,880,040 A | 3/1999 | Sun et al. | 438/769 |
| 5,940,716 A | 8/1999 | Jin et al. | 438/424 |
| 5,940,736 A | 8/1999 | Brady et al. | 438/787 |
| 5,946,559 A | 8/1999 | Leedy | 438/157 |
| 5,960,297 A | 9/1999 | Saki | 438/424 |
| 5,989,978 A | 11/1999 | Peidous | 438/436 |
| 6,008,126 A | 12/1999 | Leedy | 438/667 |
| 6,025,280 A | 2/2000 | Brady et al. | 438/762 |
| 6,046,464 A | 4/2000 | Schetzina | 257/96 |
| 6,066,545 A | 5/2000 | Doshi et al. | 438/439 |
| 6,090,684 A | 7/2000 | Ishitsuka et al. | 438/424 |
| 6,107,143 A | 8/2000 | Park et al. | 438/296 |
| 6,117,722 A | 9/2000 | Wuu et al. | 438/238 |
| 6,133,071 A | 10/2000 | Nagai | 438/122 |
| 6,165,383 A | 12/2000 | Chou | 252/301.16 |
| 6,221,735 B1 | 4/2001 | Manley et al. | 438/426 |
| 6,228,694 B1 | 5/2001 | Doyle et al. | 438/199 |
| 6,246,095 B1 | 6/2001 | Brady et al. | 257/411 |
| 6,255,169 B1 | 7/2001 | Li et al. | 438/264 |
| 6,261,964 B1 | 7/2001 | Wu et al. | 438/705 |
| 6,265,317 B1 | 7/2001 | Chiu et al. | 438/711 |
| 6,274,444 B1 | 8/2001 | Wang | 438/299 |
| 6,281,532 B1 | 8/2001 | Doyle et al. | 257/288 |
| 6,284,623 B1 | 9/2001 | Zhang et al. | 438/424 |
| 6,284,626 B1 | 9/2001 | Kim | 438/433 |
| 6,313,486 B1 | 11/2001 | Kencke et al. | |
| 6,319,794 B1 | 11/2001 | Akatsu et al. | 438/424 |
| 6,335,239 B1 * | 1/2002 | Agahi et al. | 438/245 |
| 6,361,885 B1 | 3/2002 | Chou | 428/690 |
| 6,362,082 B1 | 3/2002 | Doyle et al. | 438/523 |
| 6,368,931 B1 | 4/2002 | Kuhn et al. | 438/359 |
| 6,403,486 B1 | 6/2002 | Lou | 438/694 |
| 6,403,975 B1 | 6/2002 | Brunner et al. | 257/15 |
| 6,406,973 B1 | 6/2002 | Lee | 438/416 |
| 6,429,061 B1 | 8/2002 | Rim | |
| 6,461,936 B1 | 10/2002 | von Ehrenwall | 438/424 |
| 6,476,462 B2 | 11/2002 | Shimizu et al. | 257/627 |
| 6,483,171 B1 | 11/2002 | Forbes et al. | 257/627 |
| 6,493,497 B1 | 12/2002 | Ramdani et al. | 385/131 |
| 6,498,358 B1 | 12/2002 | Lach et al. | 257/183 |
| 6,501,121 B1 | 12/2002 | Yu et al. | 257/310 |
| 6,503,833 B1 | 1/2003 | Ajmera et al. | |
| 6,506,652 B2 | 1/2003 | Jan et al. | 438/303 |
| 6,509,618 B2 | 1/2003 | Myers et al. | 257/413 |
| 6,521,964 B1 | 2/2003 | Jan et al. | 257/413 |
| 6,524,935 B1 | 2/2003 | Canaperi et al. | |
| 6,531,369 B1 | 3/2003 | Ozkan et al. | 438/312 |
| 6,531,740 B2 | 3/2003 | Bosco et al. | 257/347 |
| 6,586,300 B1 * | 7/2003 | Hummler et al. | 438/242 |
| 6,621,392 B1 | 9/2003 | Volant et al. | 335/78 |
| 6,635,506 B2 | 10/2003 | Volant et al. | 438/52 |
| 6,660,582 B2 * | 12/2003 | Birner et al. | 438/245 |
| 2001/0009784 A1 | 7/2001 | Ma et al. | 438/197 |
| 2002/0063292 A1 | 5/2002 | Armstrong et al. | 257/367 |
| 2002/0074598 A1 | 6/2002 | Doyle et al. | 257/345 |
| 2002/0086472 A1 | 7/2002 | Roberds et al. | 438/197 |
| 2002/0086497 A1 | 7/2002 | Kwok | 438/424 |
| 2002/0090791 A1 | 7/2002 | Doyle et al. | 438/396 |
| 2003/0032261 A1 | 2/2003 | Yeh et al. | 438/451 |
| 2003/0040158 A1 | 2/2003 | Saitoh | 438/279 |
| 2003/0057184 A1 | 3/2003 | Yu et al. | 216/79 |
| 2003/0067035 A1 | 4/2003 | Tews et al. | 257/333 |

OTHER PUBLICATIONS

Kern Rim, et al., "Characteristics and Device Design of Sub-100 nm Strained Si N- and PMOSFETs". 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress". International Electron Devices Meeting, 34.4.1, IEEE, Sep. 1999.

F. Ootsuka, et al., "A Highly Dense, High-Performance 130nm Node CMOS Technology for Large Scale System-on-a-Chip Application". International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimzu, et al., "Local Mechanical-Stress Control (LMC): A New Technique for CMOS-Performance Enhancement". International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors". IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures". Paper 6.2, pp. 140-143.

C.J. Huang, et al., "Temperature Dependence and Post-Stress Recovery of Hot Electron Degradation Effects in Bipolar Transistors". *IEEE* 1991 Bipolar Circuits and Technology Meeting 7.5, pp. 170-173.

S.R. Sheng, et al., "Degradation and Recovery of SiGe HBTs Following Radiation and Hot-Carrier Stressing". pp. 14-15.

Z. Yang, et al., "Avalanche Current Induced Hot Carrier Degradation in 200 GHz SiGe Heterojunction Bipolar Transistors". pp. 1-5.

H. Li, et al., "Design of W-Band VCOs with High Output Power for Potential Application in 77 GHz Automotive Radar Systems". 2003 IEEE GaAs Digest, pp. 263-266.

H. Wurzer, et al., "Annealing of Degraded npn-Transistors- Mechanisms and Modeling". IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs". IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistor for Bi-CMOS". IEEE Transactions on Electron Devices, vol. 41, No. 6, Jun. 1994, pp. 978-987.

* cited by examiner

STRUCTURE OF VERTICAL STRAINED SILICON DEVICES

BACKGROUND OF INVENTION

The field of the invention is that of integrated circuit processing, in particular DRAM cells having vertical pass transistors.

In the fabrication of vertical-transistor DRAM cells, both in DRAMs and in DRAM arrays in ASICs and other complex systems, the formation of the capacitor removes silicon from the trench walls in the upper part of the trench, producing an overhang of the pad nitride.

That overhang interferes with filling the upper part of the trench with the gate electrode, leaving voids in the gate electrode that are disadvantageous.

Further, for a given ground rule and inter-cell spacing, the space for bitline contacts to the upper electrode of the vertical transistor is limited. The removal of silicon from the upper trench walls further reduces the width of the bitline contacts, extending outward from the trench walls into the silicon well.

Expanding the width of the cell to accommodate a wider trench and a wider bitline contact is not an option, given the overwhelming need to reduce the transverse dimensions of the cells.

As the demand for higher performance devices increases steadily, one attractive option is the use of strained silicon to improve electron mobility.

SUMMARY OF INVENTION

A feature of the invention is compensation for the overhang of the pad nitride in a trench capacitor vertical-transistor DRAM cell by forming an epitaxial strained silicon layer on the trench walls that improves transistor mobility.

Another feature of the invention is that the added silicon removes voids from the poly trench fill.

Yet another feature of the invention is that the extra width of the added silicon reduces resistance on the bitline contact.

Yet another feature of the invention is that forming a vertical strained silicon channel improves the performance of the vertical device.

DETAILED DESCRIPTION

Figure 1:
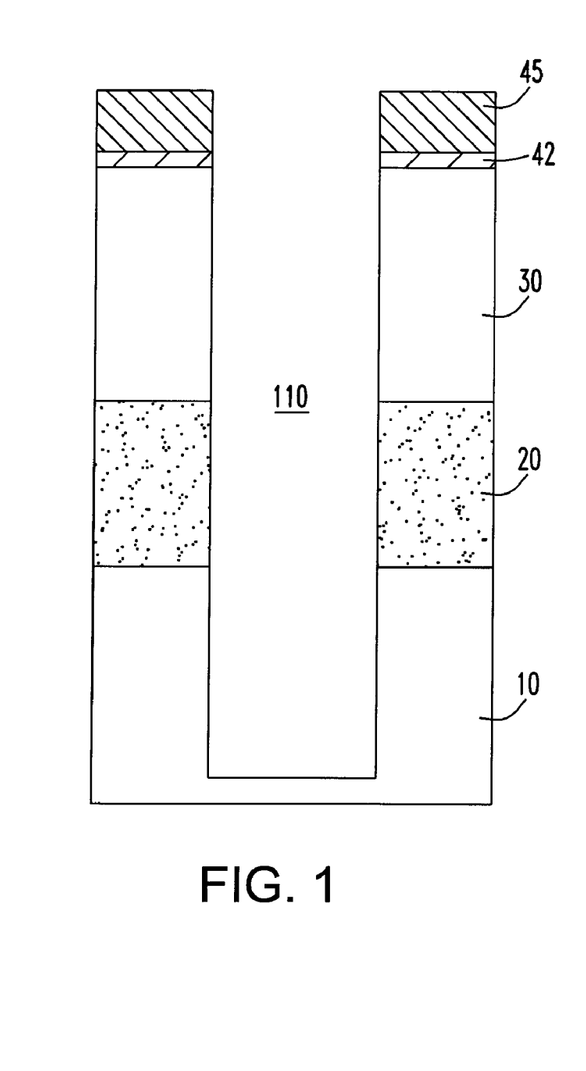
FIG. 1 illustrates a sample wafer after an initial step of etching a deep trench.

FIG. 1 shows a wafer for use in the invention, in which substrate 10 is a bulk silicon substrate, on which is formed a buffer layer 20 of SiGe alloy and a device layer 30, also of SiGe. A layer of strained silicon will be formed on the vertical face of the layer of SiGe. A transistor body will be formed within this vertical layer of strained silicon. Pad oxide 42 and pad nitride 45 complete the structure.

Layer 20 is formed on the surface of substrate 10 to accommodate the difference in atomic spacing of the two materials. There will be dislocations and other material defects in layer 20 that would be detrimental to transistor operation. As is known in the art, layer 30, a fully relaxed SiGe layer, is formed to hold the transistors, not only in the cell illustrated, but also, optionally, in logic circuits containing planar transistors that are formed elsewhere in an integrated circuit that contains the DRAM cell illustrated.

Aperture 110 is a deep trench, e.g. 8 microns deep, that will contain a DRAM cell having a vertical field effect transistor (FET) for an access device, as is known in the art.

The invention may be used with a DRAM integrated circuit, or with a circuit having other functions that contains a DRAM array. In contemporary practice, many composite systems that are fabricated in integrated circuit form, include memories that are formed from DRAMs.

Figure 2:
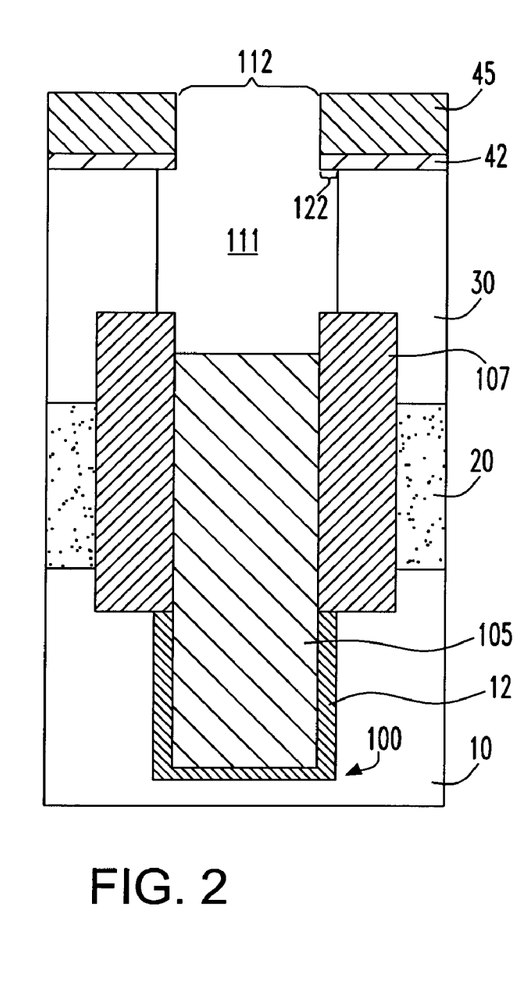
FIG. 2 illustrates the same area after forming the cell capacitor and the collar oxide.

FIG. 2 illustrates the same area after some intermediate steps that form a capacitor 100. Capacitor 100 has a dielectric 12, e.g. oxide ($SiO_2$) or a layer of oxide adjacent to a layer of nitride ($Si_3N_4$). A central electrode 105, formed by deposition of doped polysilicon (poly) or other conducting materials such as metals, completes the capacitor and will make contact with an access transistor to be constructed in the upper part of the trench.

A collar 107 (illustratively oxide) has been formed after the completion of the initial portion of the capacitor and before the extension of the central electrode. Oxide collars are conventional and are formed by oxidizing the vertical silicon (and/or the SiGe) exposed by the construction of the trench. Alternatively, the collar may be formed on the trench sidewall by conventional deposition techniques such as chemical vapor deposition (CVD). The deposited material is removed from the trench bottom by techniques such as reactive ion etching (RIE), leaving the collar material on the trench sidewall. Other insulating materials may also be used to form the collar.

After the collar has been formed, the central portion of the trench is filled with a conducting material such as polysilicon, or a combination of several conducting materials such as polysilicon and titanium nitride, that is then recessed to leave a portion of the collar exposed.

In this case, the collar extends below and above the defect-laden layer 20, thus also protecting the other parts of the structure from being affected by defects in layer 20.

An aperture 111 now remains above the top surface of poly electrode 107. The width of aperture 111 in this Figure, denoted by bracket 112, will be referred to as the original trench width. As can be seen in FIG. 2, the process of forming the capacitor and the collar has consumed some of the SiGe in the device layer 30, leaving an overhang below the pad oxide 42 that is denoted by bracket 122. This overhang has presented a problem in the prior art because conventional deposition of materials such as the gate electrode will not completely fill the trench due to the overhang, so that voids tend to form in the filling material.

Figure 3:
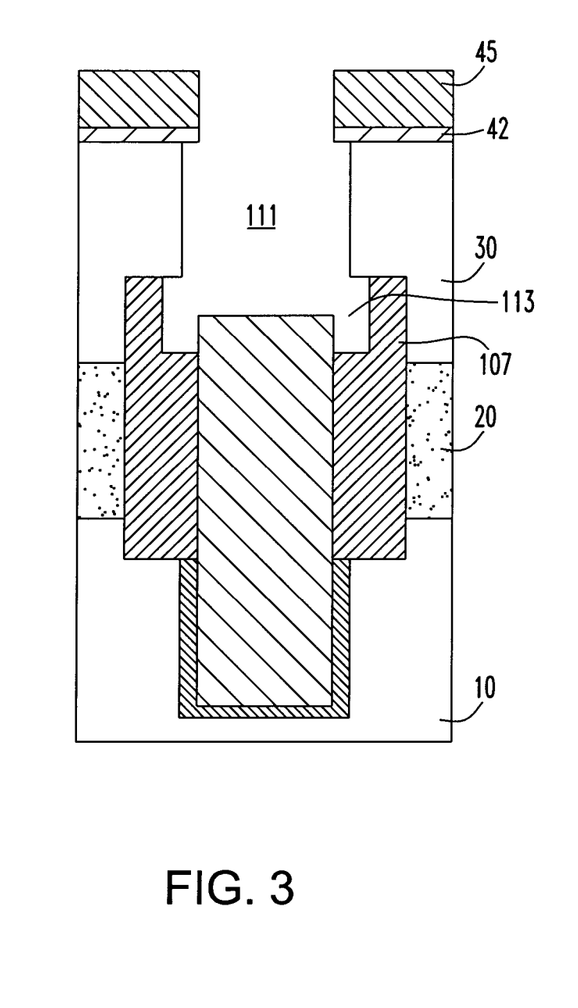
FIG. 3 illustrates the cell after forming the aperture for the buried strap.

FIG. 3 shows the same cell after a step of etching the top and inner corners of collar 107 in a wet etch step to form apertures 113 extending transversely from and below the top surface of poly 105.

Figure 4:
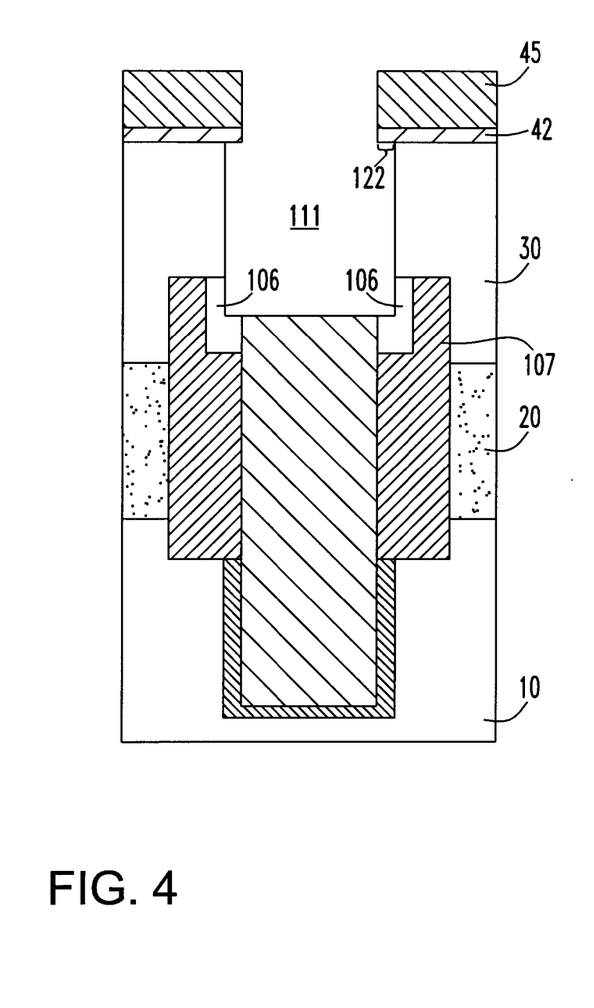
FIG. 4 illustrates the cell after forming the buried strap.

FIG. 4 shows the result of filling apertures 113 in the poly and then recessing the fill material to leave the new poly only in the apertures 113, forming buried straps 106.

Figure 5:
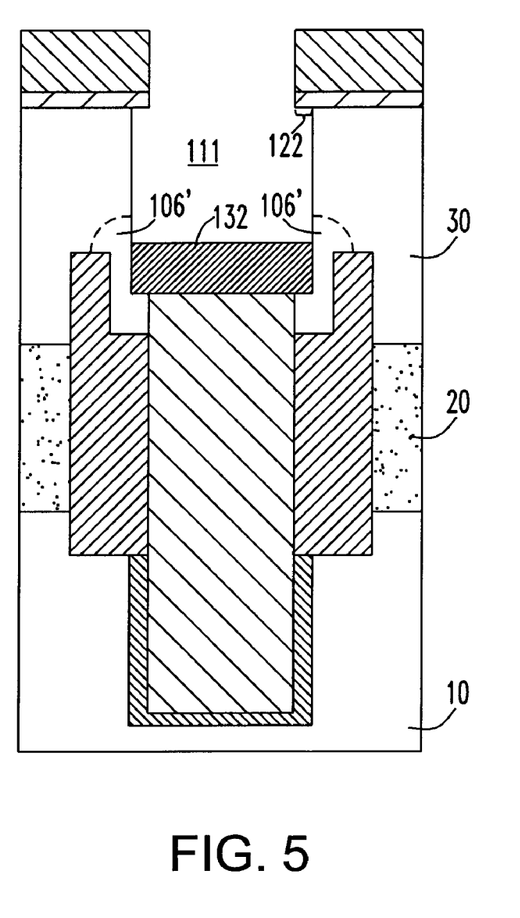
FIG. 5 illustrates the cell after forming the trench top oxide.

FIG. 5 shows the result of depositing a layer of insulator 132, referred to as the trench top oxide that fills the space above the central electrode of the capacitor and isolates it from the gate electrode of the vertical transistor that will be deposited.

At any convenient time, an annealing step drives dopant from the poly 105 and/or from the deposited buried strap into the SiGe device layer to form an extended buried strap 106' that extends the dopant into the device layer, making contact with an area that will be part of the lower electrode of a vertical FET.

The process of depositing oxide in the aperture and etching any material that has adhered to the trench walls will increase the extent of overhang 122.

Figure 6:
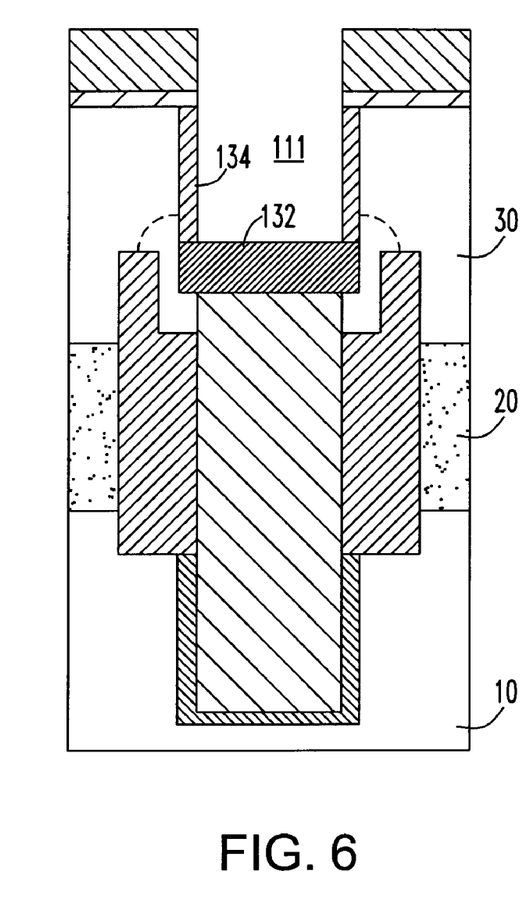
FIG. 6 illustrates the cell after the epi step.

FIG. 6 shows the result of an epitaxial deposition of silicon 134, referred to as a body layer, which has been deposited epitaxially on the exposed surface of layer 30. Layer 134 will become part of the body of the vertical FET.

Epi layer 134 has been deposited to a nominal thickness equal to the length of overhang 122, so that the new vertical surface of the transistor body is substantially aligned with the original trench width defined by the vertical face of pad nitride 45.

Since the inter-atomic distance in SiGe is greater than the corresponding distance in crystalline silicon, the silicon in layer 134 is strained. That strain increases the mobility of the vertical transistor and therefore increases the performance of the transistor.

The transverse dimension of the trench is decreased by twice the thickness of layer 134. The performance of a transistor in a strained silicon layer is greater than the performance of a comparable transistor in a SiGe layer. In some cases, the extra performance may not be required and it may be preferable to put down a layer of SiGe on the vertical face of the SiGe layer and to use that layer as the body of the vertical transistor.

The transverse dimension of the trench is decreased by twice the thickness of layer 134. For a given ground rule, the dimension of the trench and the spacing between the gate electrode and the passing wordline (shown in FIG. 9) is fixed, so that decreasing the trench width frees up area for other purposes, as will be described below.

Figure 7:
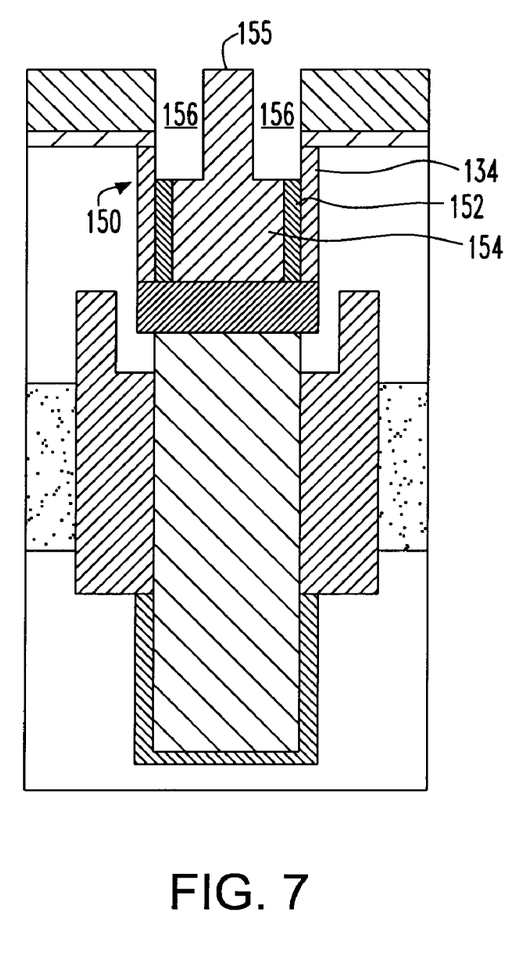
FIG. 7 illustrates the cell after growing the gate oxide and filling the gate electrode.

FIG. 7 shows the transistor area, denoted generally with numeral 150 and having the result of forming gate dielectric 152 e.g., thermally grown oxide, on layer 134, filling the remaining aperture with conducting material 154 and then optionally etching the outer portion of the top of the conducting material 155 to form apertures 156. The conducting material 154 is preferred to be polysilicon.

Figure 8:
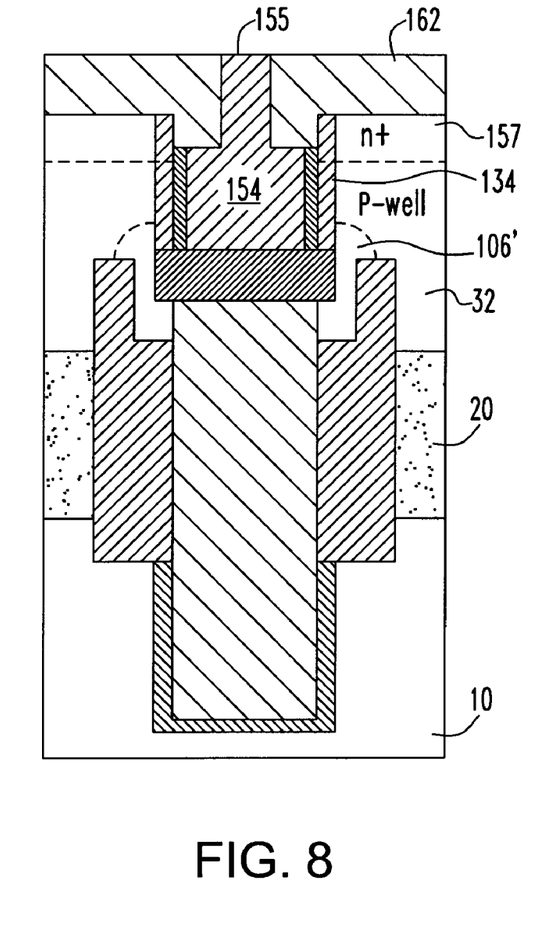
FIG. 8 illustrates the cell after forming the array top oxide.

FIG. 8 shows the result of stripping pad nitride 45, implanting dopant in the upper portion of layer 30 to form, depending on the operation of the transistor, a drain or source 157 of the transistor and filling apertures 156 with array top insulating material 162 such as oxide 162, separating the gate contact 155 from the drain 157. Isolation trenches (not shown) may be formed at any convenient time to isolate cells and devices in the other portion of the circuit.

The cell is not complete until a contact has been formed to the bitline of the DRAM array (at the upper electrode of the vertical transistor) and a gate contact has been formed to the wordline of the DRAM array (at the gate of the access transistor).

Figure 9:
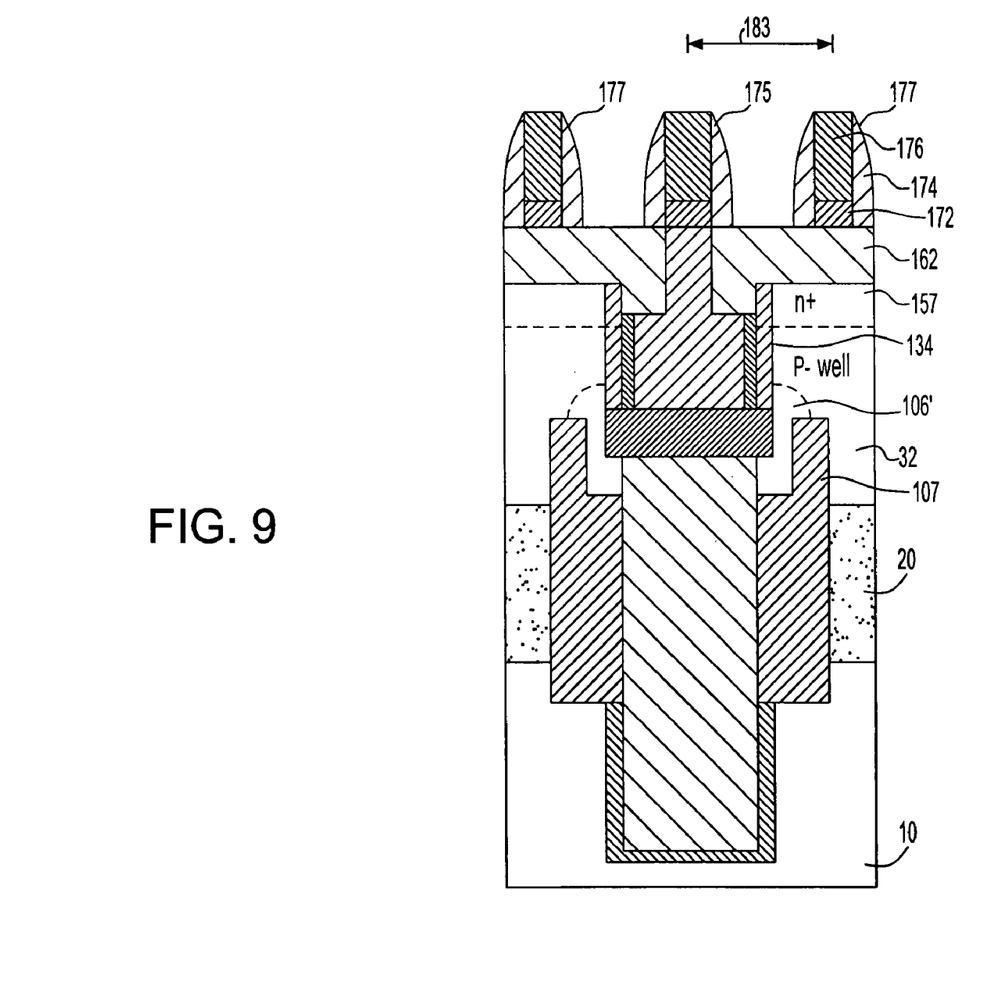
FIG. 9 illustrates the cell after forming gate contacts.

FIG. 9 shows the result of an intermediate step of forming a wordline structure 175 or 177, comprising an extension 172 of the gate contact 155 and associated cap and spacer layers. Polysilicon, tungsten, tungsten silicide, or any other suitable conducting materials, or any of their combination may be used to form the wordline structure. Layer 172 that is in contact with poly 155 may be capped by an insulating material 176, such as nitride.

The wordline structures are formed by deposition of a layer 172 of wordline material and a nitride cap. Gate contact lithography defines a stack of conductive member 172 capped with nitride 176.

Sidewalls 174 are formed on the sides of the gate stack by depositing a nitride layer or other suitable materials by a conventional process such as CVD and etching the flat portions in a directional etching process such as RIE.

Three structures are shown in FIG. 9—the wordline structure in the center, denoted by numeral 175 and two passing wordline structures 177 that are wordlines for rows of cells in front of and behind the cell illustrated, using a conventional folded wordline layout. Alternatively (not shown), the wordline may be offset from the center of element 155.

The spacing 183 between the gate contact for the illustrated cell and the passing wordline on the right is set by the groundrules. For a given groundrule, therefore, the increase in trench width caused by the consumption of silicon reduced the space available for the bitline contact for the trench, which has to be outside the trench and not contacting the passing wordline 177.

Figures 10A, 10B:
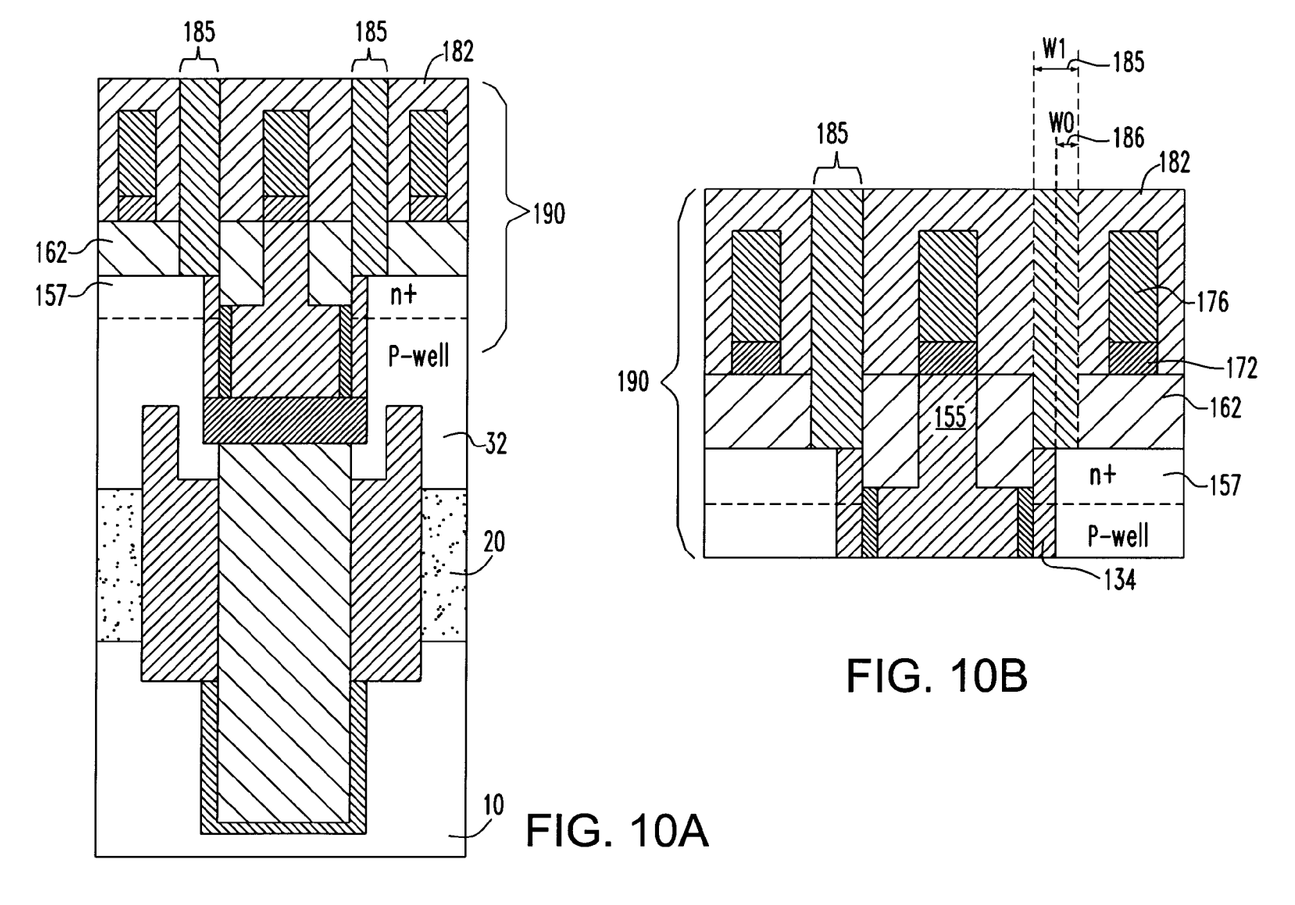
FIG. 10A and FIG. 10B illustrate the cell after forming bitline contacts.

FIG. 10A shows the cell after depositing a first layer of interlevel dielectric 182 (BPSG in this case), opening a contact aperture for the bitline contact and filling the aperture with conducting materials such as W or polysilicon to form contact 185.

The region of the top of the cell denoted with bracket 190 is enlarged in FIG. 10B, showing section of array top dielectric 162 penetrated by gate electrode contact 155 in the center and two bitline contacts 185 on the left and right of gate contact 155.

Above the right bitline contact 185 a bracket labeled 185 indicates the width of the bitline contact according to the invention. Arrow 186 indicates the width in a prior art arrangement in which the layer 134 of strained silicon is not deposited, so that the distance 186 is the width available for the bitline contact—extending from the recessed trench wall on the right to the left edge of arrow 185, which is at the location of the vertical edge of pad nitride 45.

In the past, the distance between the trench walls as they were recessed into the layer 30 set the width of the trench and therefore by subtraction the width available for the bitline contact.

In a cell according to the invention, the added width of the strained silicon 134 narrows the trench aperture and therefore increases the space available for the bitline contact. With a wider contact, the resistance of the electron path in and out of the capacitor is reduced.

The bottom of bitline contact 185 is in electrical contact with the top of layer 134 and with drain or source 157.

While the invention has been described in terms of a single preferred embodiment, those skilled in the art will recognize that the invention can be practiced in various versions within the spirit and scope of the following claims.

The invention claimed is:

1. An integrated circuit structure comprising a vertical transistor comprising:
   a semiconductor wafer having a layer of SiGe alloy above and substantially parallel to a bulk semiconductor substrate;
   said wafer having a trench etched through the layer of SiGe into the bulk substrate;
   an isolating collar formed within the trench;
   a lower contact for the vertical transistor formed above the isolating collar, the lower contact being in contact with a portion of the SiGe layer above the isolating collar;
   a vertical body layer of strained silicon formed on an exposed vertical surface of the SiGe layer within the trench, said exposed vertical surface being recessed transversely from an original trench width, and said body layer extending upward substantially at said original trench width from the top surface of the lower contact, whereby the body layer of silicon is strained;
   a gate dielectric layer formed on an exposed vertical surface of the silicon body layer within the trench, thereby isolating the body layer from the trench interior;
   a gate electrode formed within the trench and separated from the body layer of silicon by the gate dielectric layer; and
   an upper electrode of the transistor formed in contact with the body layer of silicon, thereby establishing a path for conducting carriers from said lower contact to said upper contact through said vertical body layer.

2. A structure according to claim 1, in which said SiGe layer is a fully relaxed layer separated from a silicon bulk substrate by a buffer layer of SiGe.

3. A structure according to claim 1, in which said body layer of silicon is formed under an overhang of a pad dielectric and extending out into said trench to said original trench width;
   further comprising a portion of said gate electrode extending up to a wafer surface thereby leaving a central gate electrode of width less than said original trench width, said central gate electrode having at least one aperture adjacent thereto that extends outward to said original trench width and down to make contact with said upper electrode; and
   dielectric filling said aperture adjacent to said central gate electrode to isolate said central gate electrode.

4. A structure according to claim 3, further comprising a gate contact formed on said central gate electrode, capped by a gate contact cap and bracketed by gate contact sidewalls; and
   an aperture for a drain contact formed adjacent to one of said gate contact sidewalls, said aperture being located transversely with respect to said central gate electrode to make contact with said vertical body layer and with said drain.

5. A structure according to claim 2, in which said body layer of silicon is formed under an overhang of a pad dielectric and extending out into said trench to said original trench width;
   further comprising a portion of said gate electrode extending up to a wafer surface thereby leaving a central gate electrode of width less than said original trench width, said central gate electrode having at least one aperture adjacent thereto that extends outward to said original trench width and down to make contact with said upper electrode; and
   dielectric filling said aperture adjacent to said central gate electrode to isolate said central gate electrode.

6. A structure according to claim 5, further comprising a gate contact formed on said central gate electrode, capped by a gate contact cap and bracketed by gate contact sidewalls; and
   an aperture for a drain contact formed adjacent to one of said gate contact sidewalls, said aperture being located transversely with respect to said central gate electrode to make contact with said vertical body layer and with said drain.

7. An integrated circuit containing at least one DRAM cell having a vertical transistor comprising:
   a wafer having a layer of SiGe alloy above a bulk semiconductor substrate;
   a trench having an original trench width extending down through the layer of SiGe into the bulk substrate;
   a capacitor formed within a lower portion of said trench;
   an isolating collar formed within said trench above said capacitor;
   a lower contact for the vertical transistor formed above said isolating collar, said lower contact being in contact with a portion of the SiGe layer above the isolating collar;
   an isolating layer formed within the trench overlapping vertically the lower contact, thereby separating said capacitor from an upper portion of said trench;
   a vertical body layer of strained silicon disposed on an exposed vertical surface of said SiGe layer within the trench, said exposed vertical surface being recessed transversely from an original trench width, and extending upward substantially at said original trench width from the top surface of the isolating layer, whereby said body layer of silicon is strained;
   a gate dielectric formed on an exposed vertical surface of said silicon body layer within the trench, thereby isolating said silicon body layer from the trench interior;
   a gate electrode formed within the trench and separated from said body layer of silicon by said gate dielectric layer; and
   an upper electrode of a FET transistor in contact with said body layer of silicon, thereby establishing a path for electrons from said lower contact to said upper contact through said vertical body layer.

8. A structure according to claim 7, in which said SiGe layer is a fully relaxed layer separated from a silicon bulk substrate by a buffer layer of SiGe.

9. A circuit according to claim 7, in which said body layer of silicon is formed under an overhang of a pad dielectric and extending out into said trench to said original trench width;
   further comprising a portion of said gate electrode extending up to a wafer surface thereby leaving a central gate electrode of width less than said original trench width, said central gate electrode having at least one aperture adjacent thereto that extends outward to said original trench width and down to make contact with said upper electrode; and
   dielectric filling said aperture adjacent to said central gate electrode to isolate said central gate electrode.

10. A circuit according to claim 9, further comprising a gate contact formed on said central gate electrode, capped by a gate contact cap and bracketed by gate contact sidewalls; and
    an aperture for a drain contact fanned adjacent to one of said gate contact sidewalls, said aperture being located transversely with respect to said central gate electrode to make contact with said vertical body layer and with said drain.

11. A circuit according to claim 8, in which said body layer of silicon is formed under an overhang of a pad dielectric and extending out into said trench to said original trench width;

further comprising a portion of said gate electrode extending up to a wafer surface thereby leaving a central gate electrode of width less than said original trench width, said central gate electrode having at least one aperture adjacent thereto that extends outward to said original trench width and down to make contact with said upper electrode; and dielectric tilling said aperture adjacent to said central gate electrode to isolate said central gate electrode.

12. A circuit according to claim 11, further comprising a gate contact formed on said central gate electrode, capped by a gate contact cap and bracketed by gate contact sidewalls; and an aperture for a drain contact formed adjacent to one of said gate contact sidewalk, said aperture being located transversely with respect to said central gate electrode to make contact with said vertical body layer and with said drain.

13. A circuit according to claim 7, in which said at least one DRAM cell comprises an array of DRAM cells.

14. A circuit according to claim 13, in which said circuit comprises a dynamic random access memory having an array of DRAM cells.

* * * * *